(12) United States Patent
Green et al.

(10) Patent No.: US 9,172,344 B2
(45) Date of Patent: Oct. 27, 2015

(54) STATISTICAL GAIN CONTROL IN A RECEIVER

(75) Inventors: Brian D. Green, Austin, TX (US); Jing Li, Austin, TX (US); Thomas Glen Ragan, Austin, TX (US); Michael R. May, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 1068 days.

(21) Appl. No.: 13/070,683

(22) Filed: Mar. 24, 2011

(65) Prior Publication Data

US 2012/0244825 A1 Sep. 27, 2012

(51) Int. Cl.
*H04B 1/06* (2006.01)
*H04B 7/00* (2006.01)
*H03G 3/30* (2006.01)
*H04B 17/318* (2015.01)

(52) U.S. Cl.
CPC ........... *H03G 3/3073* (2013.01); *H03G 3/3052* (2013.01); *H04B 17/318* (2015.01)

(58) Field of Classification Search
CPC ... H03G 3/3052; H03G 3/3073; H03G 3/001; H03G 3/3089; H04B 17/318; H04B 17/00; H04B 1/06; H04B 7/00; H04L 27/2647; H04L 27/08
USPC .......... 455/232.1, 241.1, 240.1, 242.2, 245.2, 455/247.1, 226.1–226.3, 230, 234.1, 234.2, 455/250.1; 375/345
See application file for complete search history.

(56) References Cited

U.S. PATENT DOCUMENTS

| | | | |
|---|---|---|---|
| 5,758,271 A | 5/1998 | Rich et al. | |
| 5,758,274 A * | 5/1998 | Vu et al. | 455/246.1 |
| 6,002,925 A * | 12/1999 | Vu et al. | 455/313 |
| 6,236,863 B1 * | 5/2001 | Waldroup et al. | 455/522 |
| 6,429,742 B1 | 8/2002 | Franca-Neto | |
| 6,510,185 B2 | 1/2003 | Lee et al. | |
| 6,930,554 B2 | 8/2005 | Mondal et al. | |
| 6,993,303 B2 | 1/2006 | Kwun | |
| 7,065,165 B2 * | 6/2006 | Heinonen et al. | 375/345 |
| 7,263,363 B2 * | 8/2007 | Ruelke et al. | 455/450 |
| 7,426,376 B2 | 9/2008 | Srinivasan et al. | |
| 7,463,704 B1 * | 12/2008 | Tehrani et al. | 375/345 |
| 7,474,882 B2 * | 1/2009 | Liu | 455/234.2 |
| 7,548,738 B2 | 6/2009 | Srinivasan et al. | |
| 7,577,415 B1 * | 8/2009 | Richards et al. | 455/266 |
| 7,623,601 B2 | 11/2009 | Khoini-Poorfard et al. | |
| 7,979,041 B1 * | 7/2011 | Zortea et al. | 455/232.1 |
| 8,064,959 B2 * | 11/2011 | Forrester | 455/562.1 |
| 8,099,070 B2 * | 1/2012 | Mu et al. | 455/209 |
| 2003/0078007 A1 | 4/2003 | Parssinen et al. | |
| 2004/0152432 A1 | 8/2004 | Gu | |
| 2005/0113046 A1 | 5/2005 | Liu | |
| 2005/0127993 A1 | 6/2005 | Yim et al. | |
| 2005/0136878 A1 | 6/2005 | Khorram | |

* cited by examiner

*Primary Examiner* — Pablo Tran
(74) *Attorney, Agent, or Firm* — Trop, Pruner & Hu, P.C.

(57) ABSTRACT

A radio frequency (RF) signal is received in a receiver, and various counts based on information from the signal can be obtained. Counts of a number of samples of the RF signal exceeding first and second thresholds can be accumulated during an accumulation window. From the first of these counts, it can be determined if the count exceeds a first metric corresponding to a first predetermined count value, and if so, a gain of an RF gain element can be reduced. From the second of these counts it can be determined if this count exceeds a second metric corresponding to a second predetermined count value, and if not, the gain can be increased.

21 Claims, 6 Drawing Sheets

STATISTICAL GAIN CONTROL IN A RECEIVER

BACKGROUND

Radio receivers are used to receive an incoming radio frequency (RF) signal, process, and downconvert the signal to a lower frequency, e.g., an intermediate frequency (IF) or a baseband frequency, where the signal can be further processed to thus output an audio signal. In typical receivers, a signal path includes multiple components, both in an RF portion of the signal path as well as lower frequency portions of the signal path such as an IF and/or baseband portions. Because an incoming signal may be of relatively low power, some of these components may provide gain to the signal. Many receivers include gain elements both at RF as well as at lower frequencies.

To control these gain elements, many receivers include some type of automatic gain control (AGC) circuitry. AGC circuitry is often used in receivers for maximizing the usable range of input signal levels to a receiver signal path. Such gain control circuitry typically analyzes the level of an incoming signal such as via a peak detection and acts to automatically adjust the gain based on the detection. Other systems use analog circuitry that estimates the root mean square (RMS, also referred to as average) value of the incoming signal. However, both peak detectors and RMS detectors are relatively complicated devices and have high levels of tolerance requirements.

Typically the gain control in such AGC circuits occurs on a schedule determined by analog averaging of the detector signals, or on a relatively simple set of fixed rules applied to the detector signals. While such AGC schemes can work well in many situations, they suffer from drawbacks, including excessive power consumption, possible signal degradation due to unnecessary updates to the gain control elements, poor use of the dynamic range of the signal path circuits, and so forth. An additional complication is that different circuit elements respond differently to overload conditions, with open-loop circuits such as low noise amplifiers (LNAs) and mixers typically showing more gradual degradation as overload level increases, while closed-loop circuits such as programmable gain amplifiers (PGAs) typically show very abrupt and rapid degradation as overload level increases. Getting the best performance from a signal chain therefore requires an AGC scheme that is aware of these characteristics and can adjust gains appropriately. Furthermore, for multi-band receivers, because of the different types of encodings and modulation schemes for different bands, a single type of detector may not be applicable to multiple bands.

For example, for an FM band a constant envelope signal is received and thus has a relatively low (or zero) peak-to-average ratio (PAR). Therefore for receiving an FM signal an AGC scheme based on peak level will perform relatively similarly to an AGC scheme based on RMS level. However, certain digital bands such as digital audio broadcast (DAB) radio have an almost Gaussian distribution with a high PAR value. In this case an AGC scheme based on peak level will perform very differently from an AGC scheme based on RMS level. Accordingly, a single gain control hardware and algorithm for multiple bands can leave headroom or suffer overloading of a receiver.

For example, if a gain control system designed for an FM signal based on peak level is used for DAB reception, a very low range RMS signal will occur, losing dynamic range of the signal chain open-loop circuits. If the FM gain control is based on RMS signal level, then in DAB reception, very high range peak signals will occur, causing severe overload of the signal chain closed-loop circuits.

In contrast, if a gain control system designed for DAB signals based on peak level is used for FM reception, a very high range RMS signal will occur, causing severe overload of the signal chain open-loop circuits. If the DAB gain control is based on RMS signal level, then in FM reception very low range peak signals will occur, losing dynamic range of the signal chain closed-loop circuits.

SUMMARY OF THE INVENTION

According to one aspect, the present invention includes a method for performing flexible gain control in a receiver. The method can be performed at multiple locations within a signal processing chain, using combinations of hardware, software, and or firmware to perform appropriate gain control depending on a type of incoming signal, its strength, and the location of the gain control element within the signal processing chain.

In one such embodiment, a radio frequency (RF) signal is received in a receiver, and various counts based on information from the signal can be obtained. Specifically, counts of a number of samples of the RF signal exceeding multiple (e.g., first and second) thresholds during an accumulation window can be accumulated. From one of these counts, it can be determined if the count exceeds a first hit ratio corresponding to a first predetermined count value, and if so, a gain of an RF gain element can be reduced. In addition, from another of these counts it can be determined if this count exceeds a second hit ratio corresponding to a second predetermined count value, and if not, the gain can be increased.

In some embodiments the determination using the first count may occur after a single accumulation window, while the determination using the second count may occur after multiple accumulation windows. The counts may be accumulated in dedicated gain control hardware of the receiver, and then provided to a controller of the receiver for further processing, and determining in the controller if the first and second counts exceed the corresponding first and second hit ratios.

Another aspect of the present invention is directed to a receiver that includes an RF signal path to receive and process an RF signal, where the RF signal path includes a gain element to receive and adjust a gain of the RF signal. In turn, the RF signal path may process and downconvert the RF signal, and provide a lower frequency signal (e.g., at an intermediate frequency) to another signal path that includes another gain element. A first threshold detector coupled to the RF signal path detects when the RF signal exceeds a first threshold, and a first counter stores a first count of a number of times the RF signal exceeds the first threshold during a first statistical window. A controller can receive this first count and control the RF gain element based at least in part on the first count. In addition, a second threshold detector coupled to the other signal path detects when the downconverted signal exceeds a second threshold, and a second counter stores a second count of a number of times this signal exceeds the second threshold during a second statistical window.

In some embodiments, to reduce power consumption, the threshold detectors can be de-coupled from the corresponding signal path (and/or de-powered) when not enabled. Further, while described at a high level with 2 threshold detectors and 2 counters, understand that multiple detectors and counters can be present in different embodiments. Furthermore, each detector can be alternately controlled to operate at different threshold levels to thus obtain counts for each of multiple thresholds.

Yet another aspect is directed to a system that includes a radio receiver to receive multiple radio bands. As above, the radio receiver can include a first threshold detector coupled to a RF signal path to detect when an RF signal exceeds a first threshold, a first counter to store a first count of a number of times the RF signal exceeds the first threshold during a first statistical window, and a second counter to store a second count of a number of times the RF signal exceeds a second threshold during a second statistical window, where the second threshold is less than the first threshold. In addition, a second threshold detector is coupled to a second frequency signal path to detect when a second frequency signal downconverted from the RF signal exceeds a third threshold, a third counter to store a third count of a number of times the second frequency signal exceeds a third threshold during a third statistical window, and a fourth counter to store a fourth count of a number of times the second frequency signal exceeds a fourth threshold during a fourth statistical window. The receiver may further include or be coupled to a controller to control a gain of a first gain element based at least in part on the first and second counts, and to control a gain of a second gain element based at least in part on the third and fourth counts.

DETAILED DESCRIPTION

Figure 1:
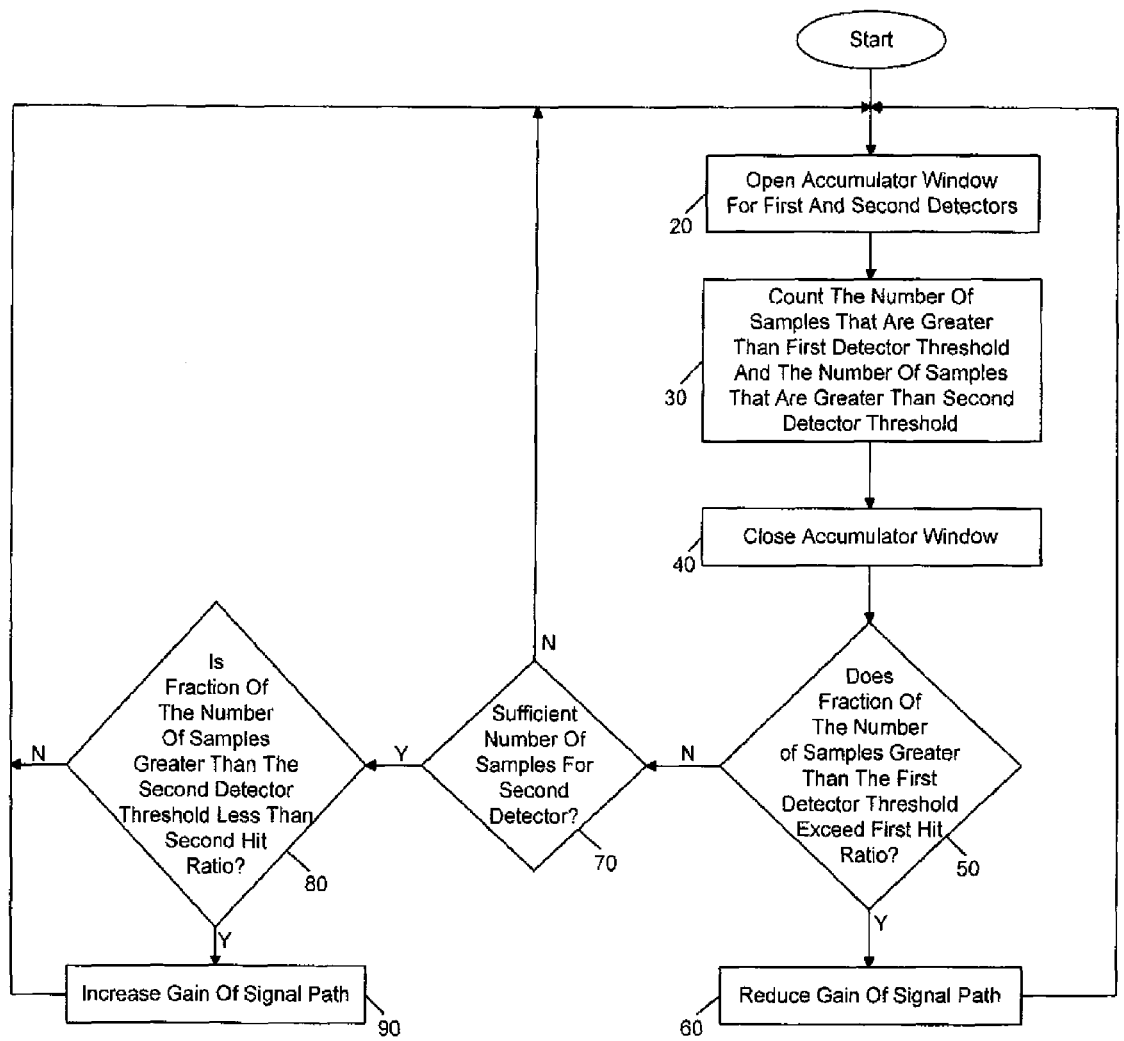
FIG. 1 is a flow diagram of a method in accordance with one embodiment of the present invention.

Embodiments may improve the performance of a signal chain across multiple bands and signal characteristics via a gain control scheme that can widely adapt its performance in response to different signal characteristics, without requiring multiple different types of hardware detectors for each band and signal type.

In various embodiments, gain control circuitry can utilize statistical information to perform gain control. Accordingly, more effective gain updates can occur, as a statistical basis for the updates exists. That is, rather than updating a gain control element based on a single metric, e.g., peak signal level, embodiments may obtain information within a statistical window and based on such information control the gain accordingly. In some embodiments, this statistical information may be by way of counts of samples of an incoming signal that meet or exceed different thresholds. Accordingly, embodiments may use one or more threshold detectors, which can be implemented, for example, by way of comparators, rather than more complex detectors such as peak detectors or RMS estimation detectors.

Furthermore, based on the statistical information obtained in a given statistical window, gain elements can be flexibly controlled. That is, depending on a particular system in which a receiver is adapted (e.g., a receiver for a mobile device such as a cellular telephone, smart phone, personal digital assistant, personal media player, car stereo or so forth) and band of operation, different considerations can be taken into account and a gain control algorithm can be flexibly accommodated by way of software and/or firmware for the particular system in which the radio receiver is incorporated.

In various embodiments, AGC circuitry can be used to maximize a usable range of input signal level substantially independently of the peak-to-average ratio (PAR) of the received signal and interferers. In this way, AGC characteristics can be flexible enough to accommodate unforeseen signal conditions and/or specific requirements of individual customers. Also, as a result of the AGC circuitry, signal path dynamic range is not wasted to accommodate rare large signal swings for a high-PAR signal. At the same time, a low-PAR signal is not allowed to exceed the dynamic range of the signal path. In some embodiments, the considerations may be achieved by combining one or more threshold-crossing signal detector circuits with digital control and digital numerical processing means (generally, a controller) to provide highly reliable, flexible and effective AGC while maintaining modest complexity, power and accuracy requirements on the signal detector circuits.

In various embodiments, multiple gain control circuits may be provided within a receiver, e.g., one or more such circuits within an RF portion of a signal path, and one or more additional circuits within, e.g., an IF portion of the signal path. In general, these gain control circuits may operate similarly to rapidly respond to reduce gain when an incoming signal strength is above certain threshold levels. However, these gain control circuits can instead slowly increase gain when lower thresholds are not met by the incoming signal. Although such fast decay, slow rise control may be appropriate for certain signal bands, e.g., FM signal bands, different control algorithms can be provided for other signal bands such as a DAB band or for other signal types such as HD™ signals transmitted within the FM signal band.

While further details regarding hardware and control methods for performing gain control will be discussed below, for an introduction to understanding gain control in accordance with an embodiment of the present invention, reference is made to FIG. 1. FIG. 1 is a flow diagram of a method in accordance with one embodiment of the present invention. In various embodiments, method 10 may be implemented in gain control circuitry, in addition to a general-purpose controller of a receiver such as a microcontroller unit (MCU) or other such controller.

As seen, method 10 may begin by opening an accumulation window for first and second detectors (block 20). In one implementation in this accumulation window, an incoming RF signal is detected by a first threshold detector (also referred to as a high threshold detector) and a second threshold detector (also referred to as a low threshold detector). The high threshold detector outputs one logic value (e.g., a logic 1 for definiteness) if the received signal crosses a threshold value for the first detector at any time during an enable window of the detector; this is called a "hit". Instead the threshold detector outputs the opposite logic value (e.g., a logic 0 for definiteness) if the received signal does not cross the threshold value at any time during the enable window; this is called a "miss".

In general, this accumulation window may correspond to a statistical window in which a number of samples of an incoming signal can be analyzed. These detectors may be, in many embodiments, relatively simple threshold detectors such as comparators having a first input to receive an incoming signal and a second input to receive a threshold value. While the implementation shown in FIG. 1 describes two such detectors, understand that in some implementations only a single detector may be present and can be multiplexed between different threshold levels based on receipt of different comparison inputs. Furthermore, understand that the method of FIG. 1 is at a high level and corresponds to control of a single gain element (e.g., an RF gain element). A similar method may be performed for control of additional gain elements of a receiver with or without additional detectors.

Referring still to FIG. 1, control passes to block 30 where a number of samples that are greater than the first detector threshold can be counted along with a number of samples that are greater than the second detector threshold (block 30). As will be discussed below, these thresholds may be set at different values, e.g., a high and low value. The controller may control the timing and duration of the enable window for the detectors. In some embodiments, dedicated hardware may be associated with the detectors to enable storage of these counts. Control then passes to block 40 where the accumulation window may close. In one embodiment, the determination of whether or not the received signal level is above the acceptable range is made based on a ratio of hits to misses and the time-variation of that ratio. The hit ratio may be chosen in such a way that the determination is substantially independent of the PAR of the received signal.

Next, at diamond 50 it may be determined whether a fraction of the number of the samples exceeding the first detector threshold exceeds a first hit ratio. Namely this first hit ratio may correspond to a ratio of the number of samples exceeding the threshold to the number of samples to be taken during the accumulation window. More simply, the hit ratio can be thought of as a predetermined number of threshold crossings during an accumulation window. Thus instead of determining the fraction of samples exceeding the detector threshold, some embodiments may compare the number of samples to a predetermined count of threshold crossings. The controller may perform this determination. Note that other embodiments of processing the number of counts greater than the first detector threshold may be used to determine the need to adjust the signal path gain. In general, the number of counts greater than the detector threshold (commonly referred to as "hits") may be passed into an arbitrary numerical function (e.g., a nonlinear FIR or IIR filter) to calculate a metric to determine if the gain of the signal path needs to be adjusted. For example, if adjacent accumulator windows have a moderately high number of hits, then this could be used to change the gain. In other embodiments, a calculation of the rate of change of the number of hits in different accumulator windows can be made and used as a basis for adjusting the signal path gain. Accordingly at diamond 50, any numerical function may be used to process the number of hits to determine the signal path gain setting. Although discussed here using a simple threshold comparison, the processing can be more generalized and fall within the scope of this invention.

Thus at diamond 50, if it is determined that the fraction of the number of samples exceeding the first detector threshold is greater than this hit ratio, control passes to block 60, where the gain of the signal path may be reduced. For example, a front end gain control element such as a low noise amplifier (LNA) may have its gain programmably reduced, e.g., by a full gain step. Thus in various embodiments, the controller may operate on the logic values output by the first threshold detector to make a determination of whether or not the received signal level is above an acceptable range for the signal path. The acceptable level of the received signal may be either its mean-square level or its peak absolute level, depending on the specific characteristics of the signal path being controlled. As seen, control returns to block 20 after such gain control has been performed. Thus this process can be repeated until the received signal is no longer above the acceptable range of the signal path.

Instead at diamond 50 if it is determined that the number of samples does not exceed the first hit ratio, control passes to diamond 70 where it may be determined whether a sufficient number of samples has been obtained for the second detector. That is, because this second detector is used to count low threshold crossings and assuming an implementation in which an overall control scheme provides for fast gain reductions and slow gain increments, more than one accumulation window's worth of samples may be obtained prior to determining whether to increase gain.

Thus assuming that a sufficient number of samples for this second detector has been obtained, control passes to diamond 80 where it may be determined whether a fraction of the number of samples exceeding the second detector threshold is less than a second hit ratio. As with diamond 50 described above, the processing of the count greater than the second detector threshold can be generalized to any numerical function. If the decision at diamond 80 is in the positive, this means that an insufficient level of gain is present and accordingly, control passes to block 90 where the gain of the second path may be increased. Stated in other words, if the number of samples exceeding the second detector threshold does not exceed a second predetermined hit count, the gain is increased. Otherwise if the number of samples exceeds the second hit rate, the gain is not adjusted. While described at this high level in the embodiment of FIG. 1, understand the scope of the present invention is not limited in this regard.

For example, in certain circumstances a gain down step may be set to be some multiple of a smallest gain step, based on a different (high) hit ratio that exceeds the first high hit ratio disclosed above. In such an implementation, e.g., on a determination that the fraction of the count of samples exceeds the first hit rate at diamond 50, control may pass to another determination as to whether the fraction of the number of samples greater than first detector threshold exceeds a different (higher) hit ratio. If not, gain of the signal path may be reduced by a minimum amount, and if instead the number of samples exceeds this higher hit rate, the gain of the signal path may be reduced by more than a minimum amount. This in general could be extended to include N high hit ratios and N corresponding amounts of gain reduction.

In various embodiments, the signal that is provided to the detectors may be a bandpass signal, where the signal of interest is concentrated in a relatively narrow frequency range B around a carrier frequency fc, with fc>>B. The received signal alternatively may be a baseband or IF signal concentrated in a frequency range B around a carrier frequency fc, with fc~O(B) (possibly fc~=0). Values for the detector thresholds, the detector enable window duration and the hit/miss ratio are all dependent on B, fc and whether the acceptable level being controlled is the mean-square level or the peak absolute level. Clearly, many combinations are possible and can be determined according to the requirements of a particular system under consideration.

For example, the decision process with regard to the high detector (which may result in a reduction of RF signal path gain) can be based on a set of e.g., 200 observations e.g., each of 1 us duration spaced, e.g., 5 us apart, while the decision process with regard to the low detector (which may result in an increase RF signal path gain) can be based on multiple observation sets (e.g., with each set having 200 observations each of duration 1 us spaced 5 us apart). Using this configuration, the mean-square signal level can be controlled to within 3 dB of the nominal maximum and minimum levels, independently of the PAR of the received signal for fc~=200 MHz and B~=1.6 MHz, using a hit ratio value~=33%.

Figure 2:
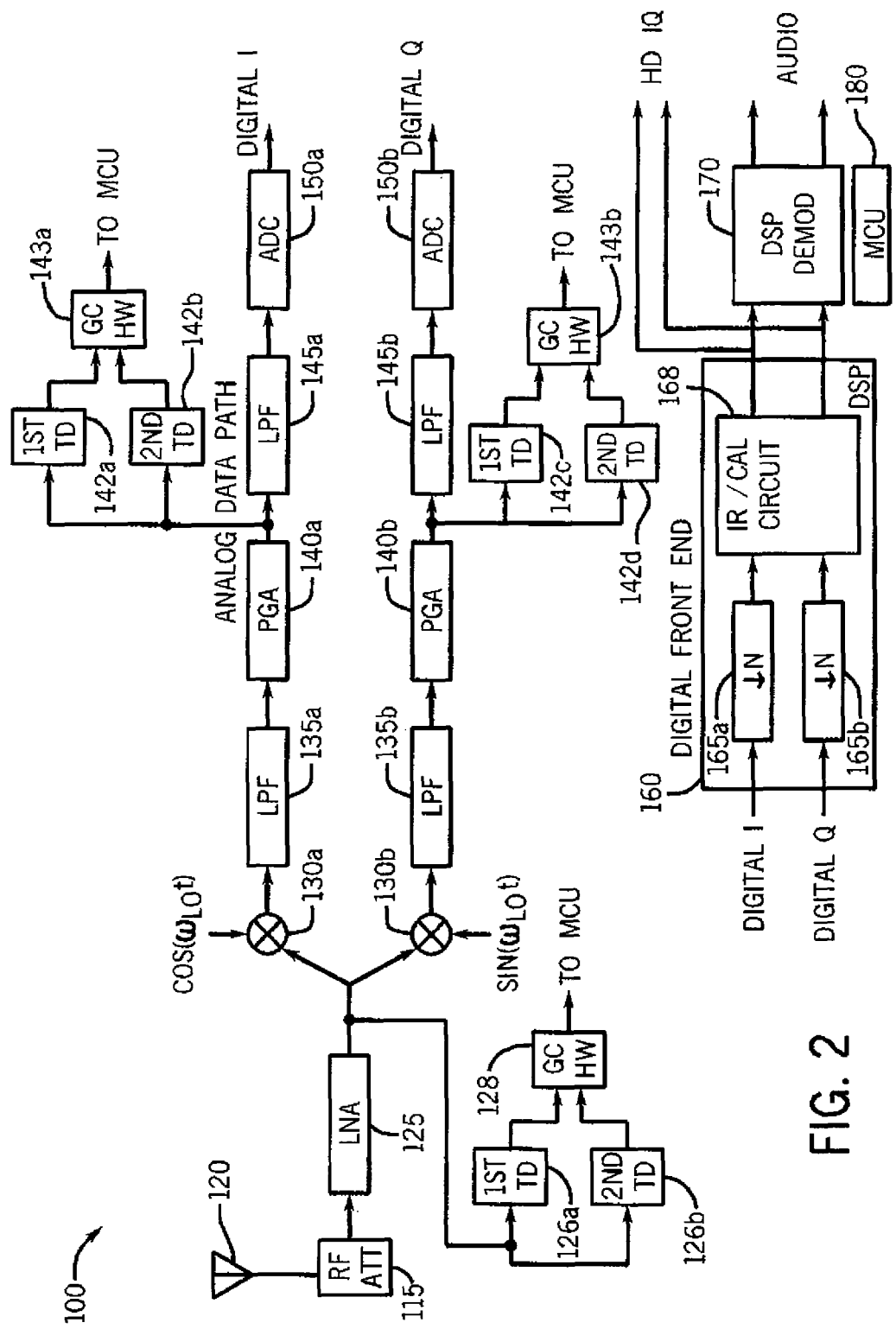
FIG. 2 is a block diagram of a portion of a receiver in accordance with an embodiment of the present invention.

Embodiments may be implemented in many different types of systems. For example, a gain control system in accordance with one embodiment of the present invention can be incorporated into various types of radios such as a standalone AM/FM/HD receiver, or a multi-band receiver, such as an AM/FM/HD/DAB/DAB+/T-DMB receiver. Referring now to FIG. 2, shown is a block diagram of a portion of a receiver in accordance with an embodiment of the present invention. As shown in FIG. 2, receiver 100 may be of a low-IF receiver architecture. In the embodiment of FIG. 2, receiver 100 is coupled to receive an RF signal via an antenna 120 that in turn is provided through an RF attenuator 115 to a low noise amplifier (LNA) 125.

As further seen in FIG. 2, the RF signal output by LNA 125 may be provided to multiple threshold detectors, namely first and second RF threshold detectors $126_a$ and $126_b$. In one embodiment, detector $126_a$ may correspond to a high threshold detector and detector $126_b$ may correspond to a low threshold detector. When enabled, e.g., by gain control hardware 128, details of which will be discussed further below, the threshold detectors may output detection outputs, e.g., a logic high or low, depending on whether the received signal within the enable window exceeds the given threshold.

In this particular embodiment, the first and second detectors thus may be located within the RF signal path, with B~=1.6 MHz and fc~=200 MHz. The acceptable level being controlled in the RF signal path can be a mean-square level. For this configuration, the high detector threshold values are set near 2 times the acceptable root-mean-square signal level, which may be between a range of approximately 5 mV-10 mV and the hit ratio may be set at a predetermined level, e.g., 32.8%. In turn, the accumulation window may be for 200 observations spaced 5 µs apart, and a detector enable window duration may be set at 1 µs. The detector enable window duration is the time during the accumulation window where the threshold detector is actively comparing the signal to a threshold. In various embodiments, the detector enable window duration may be shorter than the accumulation window to save power. The high and low detector threshold values may be set slightly further apart than the signal path gain step (e.g., 3.5 dB apart for signal path gain step size of 2 dB), in order to avoid periodic cycling or "chatter" of the signal path gain (e.g., alternating gain increase and decrease of single 2 dB step). The information from the detectors may be stored for a given accumulation window in counters present in gain control hardware 128. At the conclusion of the window, such count information may be provided to a controller, e.g., a MCU 180. MCU 180 may be configured to receive this information and based at least in part on the received information, control LNA 125 or other gain control block. To this end, MCU 180 may include a control storage such as a non-volatile memory (or it may be coupled to an on-chip non-volatile memory) that may include instructions to control various gain elements. As such, embodiments may include an article in the form of a non-transitory computer-readable medium onto which instructions are written. These instructions may enable the MCU or other programmable processor to perform gain control, as well as other processing in accordance with an embodiment of the present invention. Note that while shown in FIG. 2 as having two RF detectors, in other implementations a single RF threshold detector may be present that can be multiplexed between operation at a high threshold level and a low threshold level.

In turn, the RF signal may be provided to a complex mixer formed of mixers $130_a$ and $130_b$. As seen in FIG. 2, the receiver may have a complex signal architecture having separate IQ phases, with separate paths for I and Q phases. Each mixer 130 mixes the received RF signal with a local oscillator (LO) frequency at a different phase, 90° apart. In the embodiment of FIG. 2, mixers 130 may mix the incoming signal with a local oscillator frequency to generate an IF signal.

Various analog processing may then be performed on the IF signals. Specifically, each of the I and Q paths may include a first low pass filter (LPF) 135, a programmable gain amplifier (PGA) 140 and a second LPF 145. As seen, the IF signals output by PGAs 140 each may be provided to corresponding high and low threshold detectors of the given path. In one embodiment, detectors $142_a$ and $142_c$ may correspond to high threshold detectors and detectors $142_b$ and $142_d$ may correspond to low threshold detectors. When enabled, e.g., by corresponding gain control hardware $143_a$ and $143_b$, details of which will be discussed further below, the threshold detectors may output detection outputs, e.g., a logic high or low, depending on whether the received signal within the detector enable window duration exceeds the given threshold. This information from the detectors may be stored for a given accumulation window in counters present in gain control hardware 143. At the conclusion of the window, such count information may be provided to MCU 180, as with the RF detectors. In one embodiment, these second sets of detectors may operate in the IF signal chain, e.g., with B~=1.6 MHz and fc~=0. The acceptable level for the thresholds in the IF signal path can be the peak absolute level. In some embodiments, the accumulator window for the IF detectors may be different than for the RF detectors. However, in one embodiment a decision to reduce gain in the IF section may be made according to the same accumulation window as the RF section, but a decision to increase gain in the IF section can be on a longer accumulation window, e.g., 2000 observations. In an embodiment, the hit ratio may be set around 8.3% for the high detector, or approximately 16 hits out of 200 observations, the detector enable window duration is set at 1 µs, and the observation interval is 5 µs, just as the RF detector specific embodiment described earlier. The IF high and low detector thresholds can be set slightly further apart than the RF signal path gain step size to avoid having an RF signal path gain change consistently cause an IF signal path gain change. As will now be described, gain control may be performed somewhat differently in the IF part of the signal path.

Figure 3:
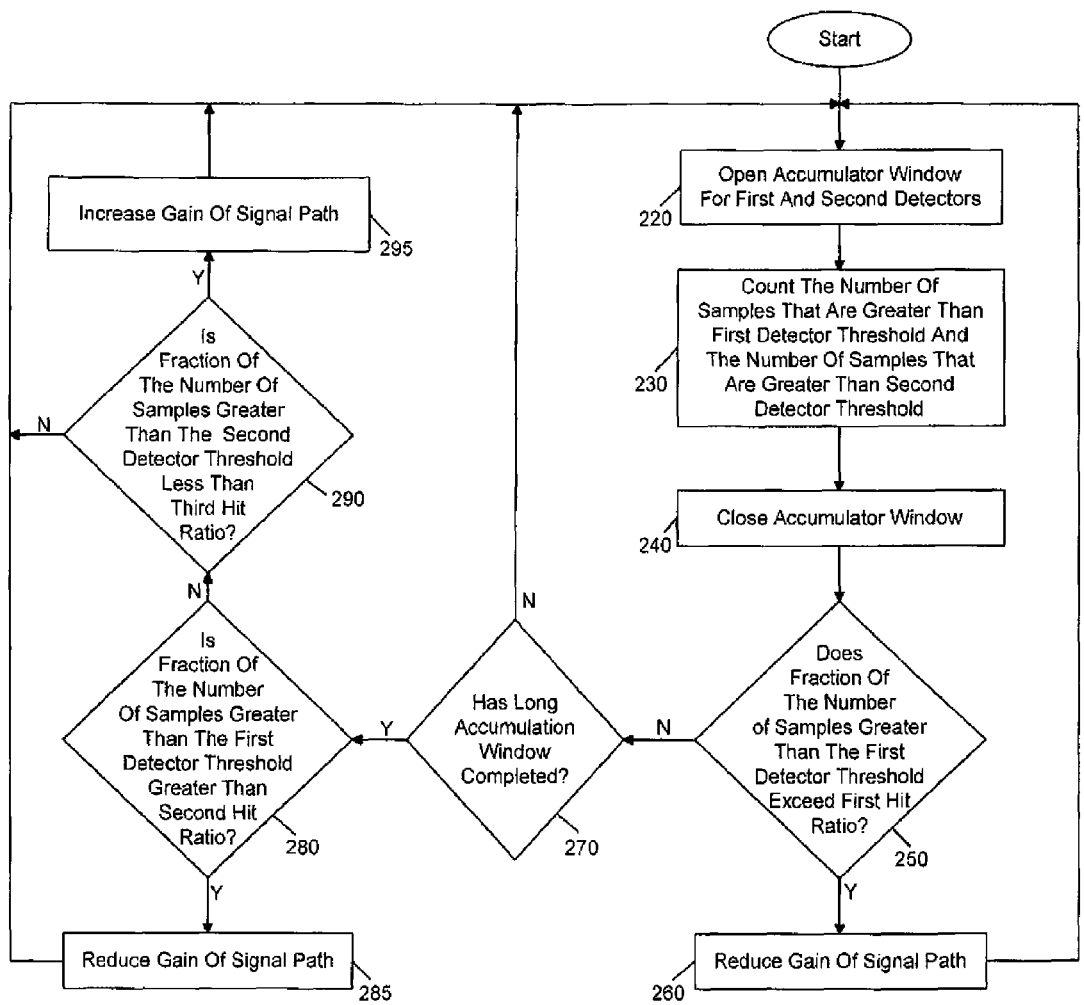
FIG. 3 is a flow diagram of a method for controlling gain in an IF section of a signal path in accordance with an embodiment of the present invention.

Referring now to FIG. 3, shown is a flow diagram of a method for controlling gain in an IF section of a signal path in accordance with an embodiment of the present invention. In various embodiments, method 200 may be implemented in gain control circuitry, in addition to a MCU or other such controller.

As seen, method 200 may begin by opening an accumulation window for first and second detectors (block 220). In this accumulation window, an IF signal can be detected by first and second threshold detectors. In general, this accumulation window may correspond to a statistical window in which a number of samples of the IF signal can be analyzed. Referring still to FIG. 3, control passes to block 230 where a number of samples that are greater than the first detector threshold can be counted along with a number of samples that are greater than the second detector threshold, and which can be stored in corresponding storages such as accumulators of gain control circuitry. Control then passes to block 240 where the accumulation window may close.

Next, at diamond 250 it may be determined whether a fraction of the number of samples exceeding the first detector threshold exceeds a first hit ratio. As above, in some embodiments the hit ratio may correspond to a predetermined number of threshold crossings during the corresponding accumulation window, in which case the number of samples exceeding the first detector threshold can be compared to this threshold number. If it is determined that the fraction of the number of samples exceeding the first detector threshold is greater than this hit ratio, control passes to block 260, where the gain of the IF signal path may be reduced. For example, a PGA can have its gain programmably reduced, e.g., by a gain step or multiple of a gain step. As seen, control returns to block 220 after such gain control has been performed. Thus this process can be repeated until the received signal is no longer above the acceptable range of the signal path.

Instead at diamond 250 if it is determined that the fraction of the number of samples does not exceed the first hit ratio, control passes to diamond 270 where it may be determined whether a long accumulation window, which in some embodiments may correspond to a plurality of the accumulation windows described in blocks 220-240, has completed. This larger accumulation window enables a longer statistical period to occur before making a decision to adjust gain. Thus assuming that this longer window has completed, control passes to diamond 280, where it may be determined whether the fraction of the number of samples exceeding the first detector threshold is greater than a second hit ratio. Note that the counts for this longer window (both for these first detector counts and for second detector counts, described below) can be stored in separate counters (each for a length of the accumulation window described in block 240), or in some embodiments at the conclusion of each shorter accumulation window, counter values can be sent for accumulation with pending counts in a MCU or other controller. Note that this second hit ratio may be set at a slightly lower level than the first hit rate discussed above, in some embodiments (e.g., the absolute number of hits can be higher, but the ratio is lower). If the decision at diamond 280 is in the positive, this means that the gain level is still too high, and accordingly control passes to block 285, where the gain can be decreased. In different embodiments, the amount of gain reduction can be the same or different than that in block 260.

If instead it is determined that the count of samples exceeding this first threshold detector is less than the second hit rate, control passes to diamond 290. There it may be determined whether a fraction of the count of samples exceeding the second (i.e., low) detector threshold is less than a third hit ratio e.g., 57/2000. Here too, the count that is analyzed may be an accumulation of counts from plural accumulations as in block 240. If this fraction of the count of samples is less than this third hit ratio, then an insufficient level of gain is present and accordingly, control passes to block 295 where the gain of the signal path may be increased, e.g., by increasing gain of the PGA. Note that in some implementations it is possible to increase gain at a lower value than the gain reductions. While described at this high level in the embodiment of FIG. 3, understand the scope of the present invention is not limited in this regard.

The IF AGC thus manipulates the IF signal path gain in order to limit, to an acceptable level, the amount of clipping present on the IF output signal. In one embodiment, each accumulation window corresponding to, e.g., a set of 200 IF high-threshold hit/miss observations is checked to see if more than a predetermined number (e.g., 16 of the 200) observations were hits; if so, the IF signal path gain is reduced by one gain selection (as in block 260). In the specific embodiment described, each gain selection is nominally 2 decibels. In addition, a long observation set is formed by totaling the number of hits from a plurality of the accumulation windows (e.g., 10 of the observation sets), yielding a long observation set (e.g., having 2000 observations). When a long observation set is complete, the number of hits in the set is checked (as in diamond 280). If the high threshold was exceeded more than a predetermined number of times (e.g., 83 times out of the 2000 observations), the IF signal path gain is decreased by one gain selection (at block 285), unless there is no smaller IF signal path gain available. If the low threshold was exceeded fewer than a predetermined number of times (e.g., 57 times out of the 2000 observations), the IF signal path gain is increased by one gain selection (at block 295), unless there is no larger IF signal path gain available. Within the limits of IF signal path gain available, this method controls the hit ratio to be near a target ratio (e.g., 3.5%, which would be 70 hits out of 2000). The number of hits required for a gain change is 13 hits different from the target value of 70 to provide high statistical confidence that the IF signal path gain needed changing. By setting the IF thresholds at higher levels and controlling the signal level to create a small, but reasonably measured chance of exceeding the threshold, the IF AGC operates to control the peak absolute value, using detector hardware that is conceptually identical to the RF detector.

Referring back to FIG. 2, the filtered signals from the LPFs are then provided to an ADC 150, which converts the analog IF signals to digital I and Q signals, which may then be provided to a digital portion of the receiver. Note that while in many implementations receiver 100 may be configured as a single integrated circuit, e.g., a CMOS device configured on a single semiconductor die, the scope of the present invention is not limited in this regard.

The digital information may be provided to a digital portion of the receiver which may include a digital front end 160 that may perform various digital processing to prepare the signals for demodulation in a DSP 170, which may thus demodulate the signals and provide demodulated data to a desired location. As seen in FIG. 2, digital front end 160 may include programmable decimators 165 to control a sampling rate of the digital signals. Note that the programmable decimation ratio N can be controlled to handle various sampling rates, e.g., for different radio bands.

In the embodiment shown in FIG. 2, front end 160 may further include an image rejection/calibration circuit 168 to handle image rejection processing and to generate samples at a desired rate, and to thereafter provide digital samples to DSP 170 which may perform demodulation according to a given encoding for the selected band. While shown with this particular implementation in the embodiment of FIG. 2, the scope of the present invention is not limited in this regard.

For example, in the embodiment of FIG. 2, since clipping is possible in each IF path, detectors are provided to prevent clipping in each path. However, in order to reduce the number of detectors required, a single high threshold detector can be used to service both the I and Q paths, and a single low detector used to service both the I and Q paths. This is achieved by deterministically switching on each observation which path each threshold detector observes. This deterministic switching may be cyclic (periodic), or may be aperiodic, arranged to avoid consistent cyclic switching for example by controlling which path is observed randomly, e.g., based on the value of a pseudo-random sequence. This switching control may be used in circumstances where the periodic nature of the signal being observed could interact with the periodic switching of observed paths to result in reduced effectiveness or failure of the signal level control.

In other embodiments, different numerical metrics (something other than hit/miss ratio, but still based on hit counts and miss counts and their time variation) could be used in conjunction with different and/or additional thresholds and/or enable window durations and/or different observation intervals to achieve the same result. In fact, this flexibility allows for AGC characteristics to be updated/modified in firmware or software without any change to the hardware. This might be done for example to address specific new signal conditions encountered in the field, or to tailor the device performance to the specific requirements of a particular customer.

Different embodiments could choose to use a single threshold detector in a time-multiplexed fashion to implement the high and low (or multiple) threshold detection function. This approach reduces further the amount of detection circuitry required, at the expense of more complex control methods. While the description above discloses controlling either the mean-square level or peak absolute level of a signal, other statistics of a signal, for example, the median absolute level can also be controlled.

Figure 4:
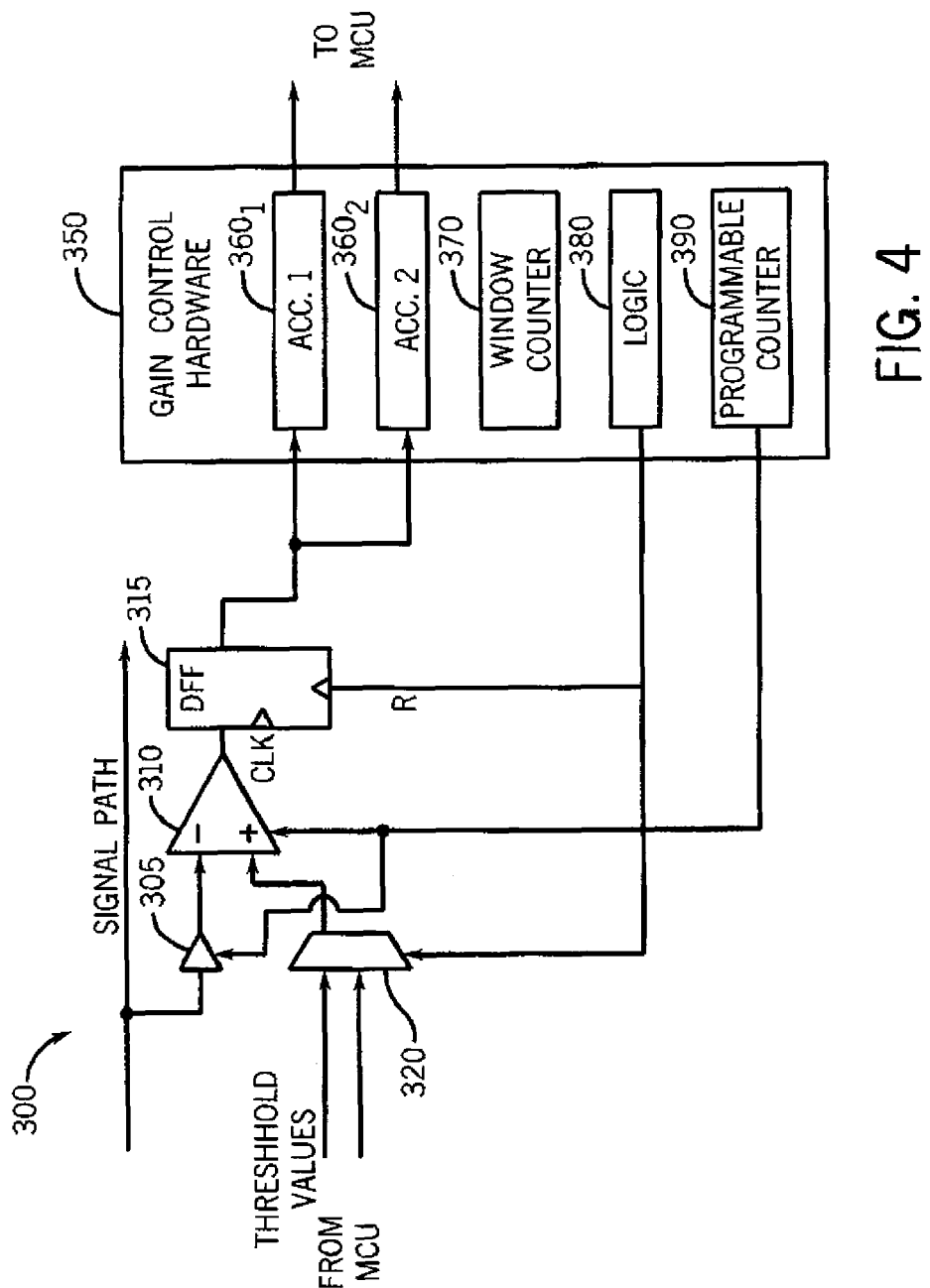
FIG. 4 is a block diagram of a gain control circuit in accordance with one embodiment of the present invention.

Referring now to FIG. 4, shown is a block diagram of a gain control circuit in accordance with one embodiment of the present invention. Note that the gain control circuitry shown in FIG. 4 may be replicated at various points within a signal path. For example, as seen above in FIG. 2, multiple threshold detectors and corresponding gain control hardware can be present in RF and IF portions of the signal path. Furthermore, understand that in light of the above discussion embodiments may include varying amounts of threshold detectors that can either be dedicated for a given high or low threshold comparison or can be shared or multiplexed between them. Further although FIG. 2 shows the presence of two sets of threshold detectors in the IF portion of the signal path, understand that in other embodiments only a single set of detectors may be provided. That is, both I and Q paths can be coupled to a single set of two threshold detectors, one for high threshold detections and one for low threshold detections. By switching both paths into these shared detectors, load balancing between the paths can be achieved, reducing mismatch concerns. However in still other embodiments, particularly where there is little or no correlation between the random sampling performed by the detectors and the incoming signal, only a single threshold detector can be present and can be multiplexed between I and Q paths and additionally multiplexed between high and low threshold detections.

With regard to FIG. 4, shown is an embodiment in which a single threshold detector is present and which is multiplexed between high and low threshold detections. Specifically as seen in FIG. 4, circuitry 300 is coupled to receive an incoming signal from a signal path. For purposes of discussion assume that this signal is an RF signal, but understand that the discussion applies equally to hardware that can be present in an IF section of a signal path. As seen, a received signal is coupled through a buffer 305 to a threshold detector 310 which in an embodiment can be a comparator. Note that buffer 305 may be controlled in some embodiments to be enabled only during an enable window for the threshold detector. Buffer 305 may be used to prevent noise from the detection circuitry from being coupled into the signal path, in part by de-coupling the threshold detector from the signal path when not enabled. In some embodiments, there may be multiple buffers or gain stages that condition the signal provided to threshold detector 310 to reduce power. In some embodiments the detector and one or more of these buffers and/or gain stages may be powered off when not enabled, and/or may have bias current reduced. Such power control may be implemented in a manner that does not perturb the RF signal path unacceptably.

As further seen, in addition to the received signal, detector 310 further receives a comparison signal at a second input. This comparison input may be received through a multiplexer 320 which selects one of multiple threshold values for providing to the threshold detector for a given enablement window. For example, in an embodiment in which the threshold detector is multiplexed between high and low threshold detections, in each successive enable window for the detector, a different one of the low and high threshold values can be provided. As seen, in an embodiment the threshold values themselves may be provided from an MCU (or other controller). These threshold values may be programmably controlled based on various parameters, including selected band, type of system in which the receiver is incorporated and so forth. The output from detector 310 may be a logic high or low value depending on whether the given enable window the received signal is above (or below) the threshold value. The output of comparator 310 may be provided to a storage element such as a D-type flip-flop 315. From there the value can be provided to a selected one of multiple accumulators of a gain control hardware 350.

Gain control hardware 350 may be a dedicated hardware circuit within the signal path circuits that handles various operations with regard to gain control and then passes results along to another controller such as an MCU. In the embodiment of FIG. 4, this hardware may include multiple accumulators $360_1$ and $360_2$. Each accumulator may store a count for a given threshold detector level, e.g., high and low. When an accumulation window has completed, a window counter 370 may cause the value stored in these accumulators (corresponding to the counts of hits occurring during a given accumulation window) to be output to the MCU. Furthermore, the window counter may also cause, on the output of these count values, the accumulators to be reset. As further seen, gain control hardware may also include a logic 380 which may be used to control various gain control circuit elements such as control of the multiplexer and the flip-flop.

As discussed above, the comparator may be enabled only during an enable window to reduce power consumption as well as to potentially avoid signal impairments with the signals on the signal path. To that end, a programmable counter 390 may be provided and may be used to enable comparator 310 (and buffer 305). In various embodiments, this counter may be a pseudo-random generator or a linear feedback shift register (LFSR) to thus periodically enable the comparator during the accumulation window. That is, to avoid the situation where a periodicity in the received signal is equal to a periodicity in the enable window, the programmable counter may randomly or at least pseudo-randomly enable comparator 310 during an accumulation window. Thus assume an implementation in which the accumulation window is to provide for 200 observations. Using programmable counter 390, 200 observations will occur, but they will occur according to an aperiodic pattern. Although shown with this particular implementation of gain control hardware in the embodiment of FIG. 4, understand the scope of the present invention is not limited in this regard.

Figure 5:
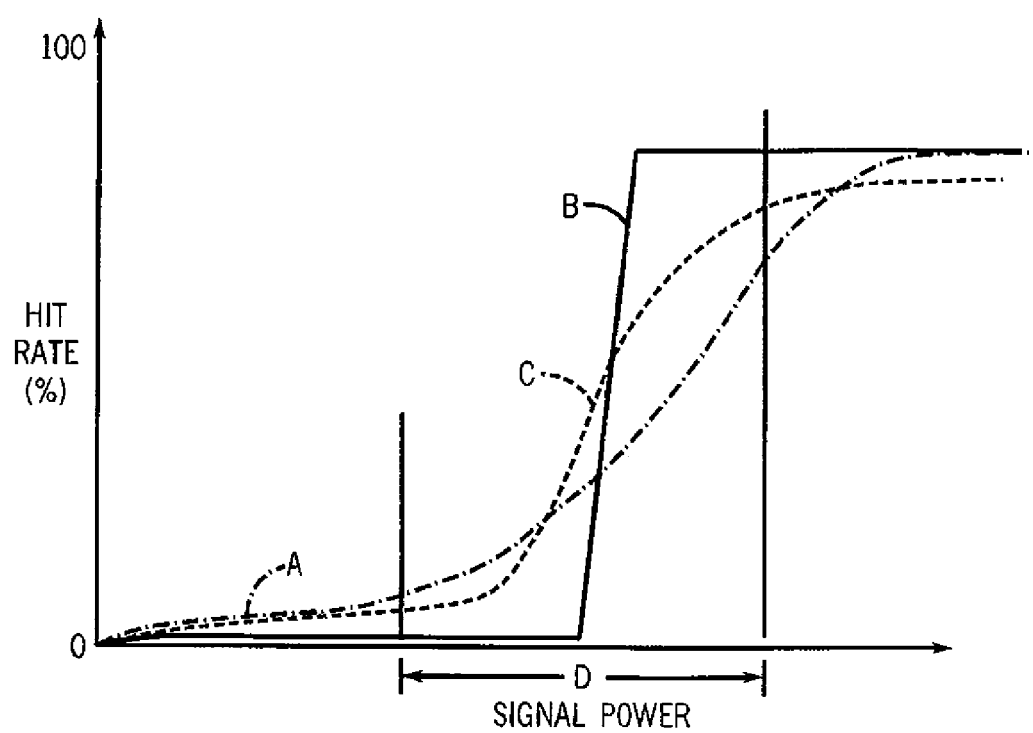
FIG. 5 is a graphical illustration comparing hit rate to signal power for multiple signal types in an embodiment of the present invention.

By flexibly controlling a hit rate for a given band in which the receiver is operating, the above-described gain control hardware and algorithms can be used for multiple bands having disparate types of modulation schemes. That is, by controlling the acceptable level by way of hit rate, gain control can occur across a relatively wide power range. Referring now to FIG. 5, shown is a graphical illustration comparing hit rate to signal power for multiple signal types. As seen, for a signal having a Gaussian-like distribution such as a DAB signal A, as the hit rate increases, the signal power may increase fairly linearly through power levels of interests (e.g., in a power range D). Accordingly, by controlling the hit rate, an acceptable signal level can be found.

In contrast, for a pure constant envelope signal B, note that the curve is almost vertical, as at a constant envelope no control of hit rate can change the signal power level. However, for a real world application of a constant envelope signal such as an FM band signal C, there are generally interferers acting within the bandwidth of the signal such that a true constant envelope signal is not present and instead a resulting signal appears more Gaussian in nature. Accordingly, a control algorithm that adjusts hit rate accordingly can also be used for an FM band.

Figure 6:
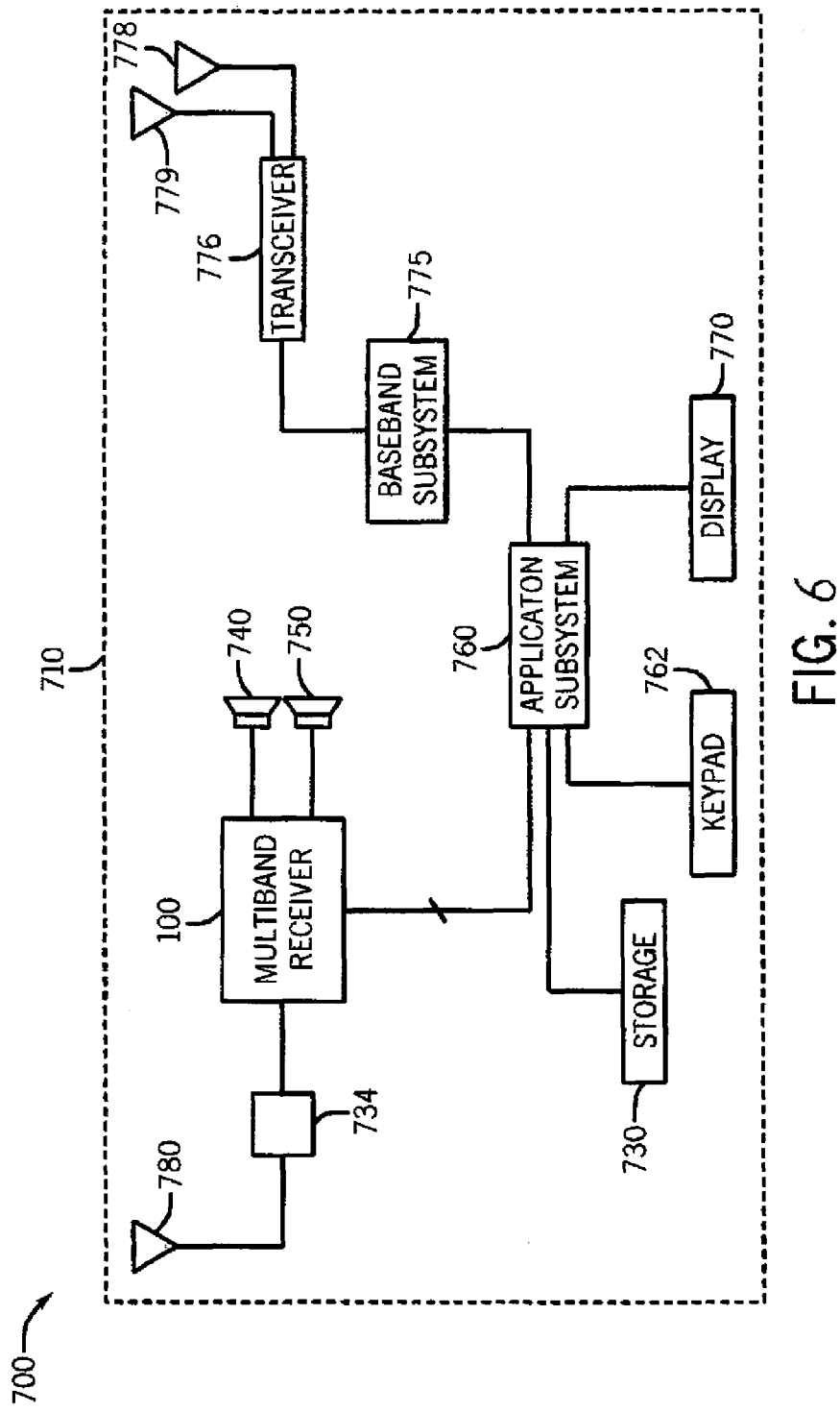
FIG. 6 is a block diagram of a multiband receiver having one or more gain elements in accordance with an embodiment of the present invention.

Embodiments may be implemented in many different system types. Referring to FIG. 6, in accordance with some embodiments of the invention, a multiband receiver 100, which may include threshold detectors that provide information to control one or more gain elements in accordance with an embodiment, may be part of a multimedia portable wireless device 710, which in turn is part of a wireless system 700. As examples, the wireless device 710 may be a multi-function, multi-band radio, cellular telephone, smart phone, PDA, tablet computer, mobile game device, or so forth and may play music, book or video downloads, and may be part of a wireless link between an antenna and a radio receiver, a terrestrial receiver, a wireless receiver, etc.

Among its other various functions, the wireless device 710 may store digital content on a storage 730, which may be a flash memory or hard disk drive, as a few examples. The wireless device 710 generally includes an application subsystem 760 that may, for example, receive input from a keypad 762 of the wireless device 710 (which may be a touch pad, e.g., of a display 770) and display information on display 770. Furthermore, the application subsystem 760 may generally control the retrieval and storage of content from the storage 730 and the communication of, e.g., audio from receiver 100. As shown, receiver 100 may be directly connected to speakers 740 and 750 for output of audio data (understand that in some embodiments a separate audio processor may be integrated between the receiver and speakers). As depicted in FIG. 6, the multimode receiver 100 may be coupled by a matching network 734 to a receiver antenna 780, or in some embodiments the matching network may not be present.

In accordance with some embodiments of the invention, the wireless device 710 may have the ability to communicate over a communications network, such as a wide area, local area, or personal wireless network. For these embodiments, the wireless device 710 may include a baseband subsystem 775 that is coupled to the application subsystem 760 for purposes of encoding and decoding signals for this wireless network. Baseband subsystem 770 may be coupled to a transceiver 776 that is connected to corresponding transmit and receive antennas 778 and 779.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
  receiving a radio frequency (RF) signal in a receiver;
  accumulating a first count of a number of samples of the RF signal greater than a first threshold during an accumulation window and accumulating a second count of a number of the samples greater than a second threshold during the accumulation window, the first threshold greater than the second threshold;
  processing the first count to produce a first processed count;
  determining if the first processed count exceeds a first metric after the accumulation window if so, reducing a gain of an RF gain element of the receiver;
  processing the second count to produce a second processed count;
  determining if the second processed count exceeds a second metric after a plurality of accumulation windows; and
  if not, increasing the gain of the RF gain element.

2. The method of claim 1, wherein determining if the first processed count exceeds the first metric includes comparing the first count to a predetermined count of first threshold crossings during the accumulation window.

3. The method of claim 1, wherein the first metric is substantially independent of a peak-to-average ratio (PAR) of the RF signal.

4. The method of claim 1, further comprising accumulating the first and second counts in a first gain control hardware of the receiver.

5. The method of claim 4, further comprising sending the first and second counts from the first gain control hardware to a controller of the receiver, and processing the first and second counts and determining if the first and second processed counts exceed the corresponding first and second metrics in the controller.

6. The method of claim 1, further comprising determining whether the samples are greater than the first and second thresholds using at least one threshold detector.

7. The method of claim 6, wherein the at least one threshold detector is a single threshold detector, and a comparison input to the single threshold detector is multiplexed between the first threshold and the second threshold.

8. The method of claim 6, further comprising enabling the at least one threshold detector for a predetermined number of comparisons during the accumulation window.

9. The method of claim 8, further comprising disabling the at least one threshold detector during the accumulation window, except for the predetermined number of comparisons.

10. The method of claim 8, further comprising enabling the at least one threshold detector aperiodically for a predetermined sample duration to perform each comparison during the accumulation window according to a pseudo-random distribution.

11. An apparatus comprising:
  a radio frequency (RF) signal path to receive and process an RF signal, the RF signal path including an RF gain element to receive and adjust a gain of the RF signal;
  a threshold detector coupled to the RF signal path to detect when the RF signal is greater than a first threshold;
  a first counter to store a first count of a number of times the RF signal is greater than the first threshold during a first statistical window;
  a second counter to store a second count of a number of times the RF signal is greater than a second threshold during a second statistical window, the second threshold less than the first threshold, the second statistical window greater than the first statistical window; and
  a controller coupled to the first counter to receive the first count and control the RF gain element based at least in part on the first count, wherein the controller is to reduce a gain of the RF gain element when the first count exceeds a first hit metric and to increase a gain of the RF gain element when the second count is less than a second hit metric.

12. The apparatus of claim 11, wherein the threshold detector is to be de-coupled from the RF signal path when not enabled.

13. The apparatus of claim 11, further comprising gain control hardware coupled to the threshold detector, the gain control hardware including:
the first counter; and
a window counter to initiate the first count at a beginning of the first statistical window and to cause the first count to be output to the controller at an end of the first statistical window.

14. The apparatus of claim 13, wherein the gain control hardware further comprises an enabler to enable the threshold detector at least pseudo-randomly for a predetermined number of detections during the first statistical window, wherein the threshold detector is to be de-coupled from the RF signal path when not enabled.

15. The apparatus of claim 11, further comprising:
an intermediate frequency (IF) signal path coupled to the RF signal path to receive an IF signal from the RF signal path, the IF signal path including an IF gain control element to receive and adjust a gain of the IF signal;
a second threshold detector coupled to the IF signal path to detect when the IF signal is greater than a third threshold; and
a third counter to store a third count of a number of times the IF signal is greater than the third threshold during a third statistical window, wherein the controller is to receive the third count and control the IF gain element based at least in part on the third count.

16. The apparatus of claim 15, wherein the IF signal path includes a I portion and a Q portion, wherein the second threshold detector is to be multiplexed between the I portion and the Q portion.

17. The apparatus of claim 15, further comprising a fourth counter to store a fourth count of a number of times the IF signal is greater than a fourth threshold during a fourth statistical window, the fourth threshold less than the third threshold.

18. The apparatus of claim 17, wherein the controller is to reduce a gain of the IF gain control element if the third count exceeds a third hit metric after the third statistical window or if a fifth count exceeds a fourth hit metric, the fifth count corresponding to a number of times the IF signal is greater than the third threshold during a plurality of third statistical windows.

19. The apparatus of claim 17, wherein the controller is to increase a gain of the IF gain control element if the fourth count is less than a fifth hit metric, the fourth count corresponding to the number of times the IF signal is greater than the fourth threshold during the fourth statistical window, the fourth statistical window corresponding to at least a plurality of third statistical windows.

20. A system comprising:
a radio receiver to receive multiple radio bands, the radio receiver including:
a first threshold detector coupled to a radio frequency (RF) signal path to detect when an RF signal is greater than a first threshold, a first counter to store a first count of a number of times the RF signal is greater than the first threshold during a first statistical window, and a second counter to store a second count of a number of times the RF signal is greater than a second threshold during a second statistical window, the second threshold less than the first threshold;
a second threshold detector coupled to a second frequency signal path to detect when a second frequency signal downconverted from the RF signal is greater than a third threshold, a third counter to store a third count of a number of times the second frequency signal is greater than the third threshold during a third statistical window, and a fourth counter to store a fourth count of a number of times the second frequency signal is greater than a fourth threshold during a fourth statistical window; and
a controller to control a gain of a first gain element based at least in part on the first and second counts, and to control a gain of a second gain element based at least in part on the third and fourth counts, wherein the controller is to reduce a gain of the second gain element a first time if the third count is greater than a first value at an end of the third statistical window and reduce the gain a second time if a plurality of third counts is greater than a second value at an end of a plurality of third statistical windows.

21. The system of claim 20, wherein the controller is to process the first and second counts and to increase the gain of the first gain element based on analysis of a first processed count and a first metric, and to reduce the gain of the first gain element based on analysis of a second processed count and a second metric.

* * * * *